United States Patent
Cheng et al.

(10) Patent No.: US 9,966,374 B2
(45) Date of Patent: May 8, 2018

(54) SEMICONDUCTOR DEVICE WITH GATE STRUCTURES HAVING LOW-K SPACERS ON SIDEWALLS AND ELECTRICAL CONTACTS THEREBETWEEN

(71) Applicant: GLOBALFOUNDRIES INC., Grand Cayman (KY)

(72) Inventors: Kangguo Cheng, Schenectady, NY (US); Ali Khakifirooz, Los Altos, CA (US); Alexander Reznicek, Troy, NY (US); Charan Veera Venkata Satya Surisetty, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/096,681

(22) Filed: Apr. 12, 2016

(65) Prior Publication Data

US 2016/0225766 A1 Aug. 4, 2016

Related U.S. Application Data

(62) Division of application No. 14/027,720, filed on Sep. 16, 2013, now Pat. No. 9,349,835.

(51) Int. Cl.
*H01L 29/51* (2006.01)
*H01L 29/417* (2006.01)
(Continued)

(52) U.S. Cl.
CPC .... *H01L 27/0886* (2013.01); *H01L 21/76837* (2013.01); *H01L 21/823468* (2013.01);
(Continued)

(58) Field of Classification Search
CPC ....... H01L 21/76837; H01L 21/823468; H01L 21/76897; H01L 21/28; H01L 21/28158;
(Continued)

(56) References Cited

U.S. PATENT DOCUMENTS 6,737,342 B1 5/2004 Lee et al.
7,253,123 B2 8/2007 Arghavani et al.
(Continued)

OTHER PUBLICATIONS

Huff et al., "High-k gate stacks for planar, scaled CMOS integrated circuits", Microelectronic Engineering 69 (2003), pp. 152-167.*
(Continued)

*Primary Examiner* — Marc Armand
*Assistant Examiner* — Younes Boulghassoul
(74) *Attorney, Agent, or Firm* — Anthony Canale; Andrew M. Calderon; Roberts Mlotskowski Safran Cole & Calderon, P.C.

(57) ABSTRACT

A semiconductor device includes gates and a low-k spacer. The low-k spacer includes low-k spacer portions formed upon the gate sidewalls and a low-k spacer portion formed upon a top surface of an underlying substrate adjacent to the gates. When a structure has previously undergone a gate processing fabrication stage, the gates and at least a portion of the top surface of the substrate may be exposed thereby allowing the formation of the low-k spacer. This exposure may include removing any original gate spacers, removing an original liner formed upon the original spacers, and removing any original fill material formed upon the liner.

16 Claims, 8 Drawing Sheets

(51) Int. Cl.
*H01L 27/088* (2006.01)
*H01L 29/66* (2006.01)
*H01L 21/8234* (2006.01)
*H01L 29/49* (2006.01)
*H01L 21/768* (2006.01)

(52) U.S. Cl.
CPC .......... *H01L 29/4983* (2013.01); *H01L 29/51* (2013.01); *H01L 29/518* (2013.01); *H01L 29/66795* (2013.01); *H01L 21/76897* (2013.01); *H01L 29/41766* (2013.01); *H01L 29/517* (2013.01); *H01L 29/6653* (2013.01); *H01L 29/66545* (2013.01)

(58) Field of Classification Search
CPC ......... H01L 21/8234; H01L 21/823864; H01L 21/823807; H01L 21/823814; H01L 21/823828; H01L 21/823871; H01L 27/0886; H01L 29/4983; H01L 29/51; H01L 29/518; H01L 29/66795; H01L 29/41766; H01L 29/517; H01L 29/6653; H01L 29/66545; H01L 29/423; H01L 29/78; H01L 29/40; H01L 29/66; H01L 29/49; H01L 29/417; H01L 29/42364; H01L 29/401; H01L 29/785; H01L 29/165; H01L 29/6659; H01L 29/66628; H01L 29/66636; H01L 29/7834; H01L 29/7848
USPC ............... 257/365, 412, 369, 288, 299, 595; 438/157, 197, 218, 230, 231, 154
See application file for complete search history.

(56) References Cited

U.S. PATENT DOCUMENTS

| | | | |
|---|---|---|---|
| 7,365,378 B2 | 4/2008 | Huang et al. | |
| 7,713,801 B2 | 5/2010 | Trivedi et al. | |
| 8,222,100 B2 | 7/2012 | Cheng et al. | |
| 8,426,266 B2 | 4/2013 | Hoentschel et al. | |
| 2005/0087775 A1 | 4/2005 | Chen et al. | |
| 2007/0281410 A1* | 12/2007 | Lee ................. | H01L 21/823864 438/197 |
| 2008/0272445 A1 | 11/2008 | Dyer | |
| 2010/0244153 A1* | 9/2010 | Hsu ................. | H01L 21/823807 257/408 |
| 2011/0175169 A1 | 7/2011 | Cheng et al. | |
| 2011/0269278 A1 | 11/2011 | Hoentschel et al. | |
| 2012/0187459 A1* | 7/2012 | Pan ................. | H01L 21/823807 257/288 |
| 2013/0049142 A1 | 2/2013 | Liu et al. | |

OTHER PUBLICATIONS

Chen et al., "Investigation of the electrical properties and reliability of amorphous SiCN", Thin Solid Films 447-448 (2004), pp. 632-637.*

Virginia Semiconductor, "The General Properties of Si, Ge, SiGe, SiO2 and Si3N4", Jun. 2002.*

Nandi, Ashutosh et al, "Design and Analysis of Analog Performance of Dual-k Spacer Underlap N/P-FinFET at 12 nm Gate Length," IEEE Transactions on Electron Devices, vol. 60, No. 5, May 2013.

* cited by examiner

SEMICONDUCTOR DEVICE WITH GATE STRUCTURES HAVING LOW-K SPACERS ON SIDEWALLS AND ELECTRICAL CONTACTS THEREBETWEEN

FIELD

Embodiments of invention generally relate to a semiconductor device, and more particularly to design structures, semiconductor devices, and formation of a semiconductor device that utilizes a low-k spacer.

DESCRIPTION OF THE RELATED ART

In semiconductor fabrication, a low-k dielectric is a material with a small dielectric constant relative to silicon nitride. A low-k spacer is made from a low-k dielectric material and electrically isolates, insulates, and/or separates conducting portions of a semiconductor device. Low-k spacers are desired to reduce parasitic capacitance between the conducting portions, and thus improve semiconductor circuit performance. However, it has been found that, a simple substitution of a conventional silicon nitride spacer with a low-k spacer in a conventional complementary metal-oxide-semiconductor (CMOS) fabrication processes has various drawbacks.

SUMMARY

Embodiments of invention generally relate to a semiconductor device, and more particularly to design structures, semiconductor devices, and formation of a semiconductor device that utilizes a low-k spacer.

In a first embodiment of the present invention, a semiconductor device includes a one or more gates upon a top surface of a semiconductor substrate and a low-k spacer. Each gate includes vertical sidewalls. The low-k spacer includes a first low-k spacer portion formed upon the vertical sidewalls of the gates and at least a second low-k spacer portion formed upon the top surface of the semiconductor substrate adjacent to the one or more gates. In another embodiment of the present invention, a design structure embodied in a machine readable storage medium for designing, manufacturing, or testing an integrated circuit includes the plurality of gates and the low-k spacer.

In another embodiment of the present invention, a method of fabricating a semiconductor device includes exposing a plurality of gates, wherein each gate includes vertical sidewalls, exposing the top surface of a semiconductor substrate adjacent to the gates, forming a first low-k spacer portion upon the vertical sidewall of a first gate, forming a second low-k spacer portion upon a vertical sidewall of a second gate, and forming a third low-k spacer portion upon the exposed semiconductor substrate top surface between the first gate and the second gate.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Figure 1:
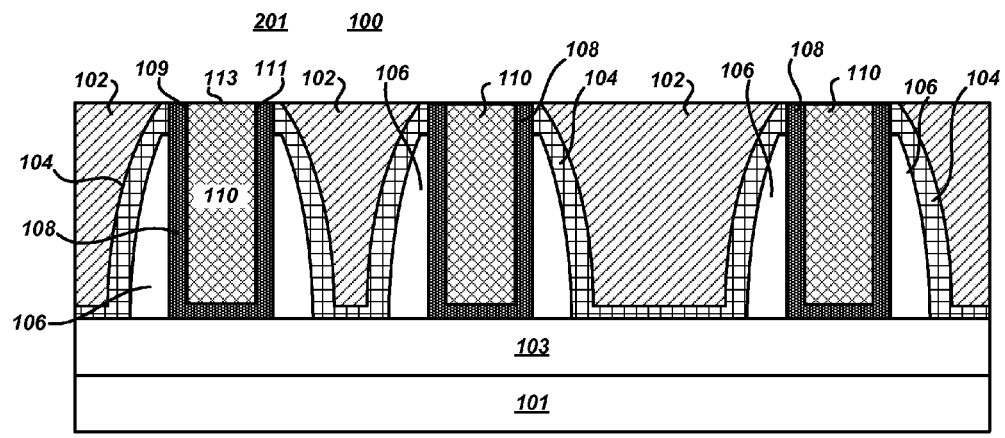
FIGS. 1-14 depict a cross section view of a semiconductor structure at intermediate stages of semiconductor device fabrication, in accordance with various embodiments of the present invention.

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention generally relate to semiconductor devices. While the appended drawings illustrate a planar device structure, it should be understood that various embodiment of the invention may be used for a non-planar device structure, such as a FinFET or gate-all-around nanowire structure. A FinFET device may include a plurality of fins formed in a wafer and a gate covering a portion of the fins. The portion of the fins covered by the gate may serve as a channel region of the device. Portions of the fins may also extend out from under the gate and may serve as source and drain regions of the device. Typical integrated circuits may be divided into active areas and non-active areas. The active areas may include FinFET devices. Each active area may have a different pattern density, or a different number of FinFET devices.

In semiconductor fabrication, a low-k dielectric is a material with a small dielectric constant relative to silicon nitride. A low-k spacer is made from a low-k dielectric material and electrically isolates, insulates, and/or separates conducting portions of a semiconductor device. Low-k spacers are desired to reduce parasitic capacitance between the conducting portions, and thus improve semiconductor circuit performance. However, it has been found that, a simple substitution of a conventional silicon nitride spacer with a low-k spacer in a conventional complementary metal-oxide-semiconductor (CMOS) fabrication processes has various drawbacks.

One drawback occurs during device fabrication where the low-k spacer is subjected to high temperature processes (e.g., source/drain anneal, etc.) causing the k-value to increase. Further, the low-k material complicates subsequent device fabrication processes. For example, the low-k dialectic results in epitaxy nodules on the low-k spacer during source/drain epitaxy. Another drawback is low-k spacer thickness variations caused by its exposure to subsequent device fabrication process such as epitaxy preclean, silicide, contact etch, post clean, etc. Further, it may be difficult to incorporate low-k spacers with self-aligned contacts (SAC) due to damage of the low-k spacer during SAC reactive ion etch (RIE). Accordingly, there is a need for an improvement in design structures, semiconductor devices, and formation of a semiconductor device that utilize a low-k spacer.

Referring now to FIGS., exemplary process steps of forming a structure 100 in accordance with embodiments of the present invention are shown, and will now be described in greater detail below. Furthermore, it should be noted that while this description may refer to some components of the structure 100 in the singular tense, more than one component may be depicted throughout the figures and like components are labeled with like numerals. The specific number of fins depicted in the figures is for illustrative purposes only.

FIG. 1 depicts a cross section view of a semiconductor structure 100 at an intermediate stage of the semiconductor device fabrication, in accordance with various embodiments of the present invention. At this stage of fabrication, structure 100 may generally include fill material 102, liner 104, spacers 106, high-k dielectric 108, gates 110, and a semiconductor substrate. Structure 100, as shown in FIG. 1, may generally result subsequent to a gate processing stage 201.

The semiconductor substrate may be a bulk semiconductor or a layered semiconductor such as Si/SiGe, a silicon-on-insulator (SOI), or a SiGe-on-insulator (SGOI). Bulk semiconductor substrate materials may include undoped Si, n-doped Si, p-doped Si, single crystal Si, polycrystalline Si, amorphous Si, Ge, SiGe, SiC, SiGeC, GaAs, InAs, InP and all other III/V or II/VI compound semiconductors. In the example shown in FIG. 1 a SOI substrate is depicted. The SOI substrate may include a base substrate (not shown), a buried dielectric layer 101 formed on top of the base substrate, and a SOI layer 103 formed on top of the buried dielectric layer 101. The buried dielectric layer 101 may isolate the SOI layer from the base substrate. It should be noted that a plurality of fins (not shown) may be etched from the uppermost layer of the SOI substrate, the SOI layer 103 or from a bulk substrate. In certain embodiments the semiconductor substrate includes source/drain regions formed in the SOI layer 103 and at each side of each gate structure 110 such that a channel region is formed in the SOI layer 102 and below each gate 110. In embodiments where the semiconductor device 100 includes one or more FinFETs, gate 110 may cover the sidewalls of each fin in the channel region.

The base substrate may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate may be about, but is not limited to, several hundred microns thick. For example, the base substrate may have a thickness ranging from 0.5 mm to about 1.5 mm.

The buried dielectric layer 101 may include any of several dielectric materials, for example, oxides, nitrides and oxynitrides of silicon. The buried dielectric layer 101 may also include oxides, nitrides and oxynitrides of elements other than silicon. In addition, the buried dielectric layer 101 may include crystalline or non-crystalline dielectric material.

Moreover, the buried dielectric layer 101 may be formed using any of several known methods, for example, thermal or plasma oxidation or nitridation methods, chemical vapor deposition methods, and physical vapor deposition methods. The buried dielectric layer 101 may have a thickness ranging from about 5 nm to about 200 nm. In one embodiment, the buried dielectric layer 101 may have a thickness ranging from about 25 nm to about 180 nm.

For clarity, the semiconductor substrate (e.g. bulk, SOI substrate including base substrate, buried dielectric layer 101, and SOI layer 103) are not shown in the following exemplary semiconductor structures 100 depicted in FIGS. 2-14.

The SOI layer 103 may include any of the several semiconductor materials included in the base substrate. In general, the base substrate and the SOI layer 103 may include either identical or different semiconducting materials with respect to chemical composition, dopant concentration and crystallographic orientation. In one particular embodiment of the present invention, the base substrate and the SOI layer 103 include semiconducting materials that include at least different crystallographic orientations. Typically the base substrate or the SOI layer include a {110} crystallographic orientation and the other of the base substrate or the SOI layer 103 includes a {100} crystallographic orientation. Typically, the SOI layer 103 may include a thickness ranging from about 5 nm to about 100 nm. In one embodiment, the SOI layer may have a thickness ranging from about 25 nm to about 30 nm. Methods for forming the SOI layer are well known in the art. Non-limiting examples include SIMOX (Separation by Implantation of Oxygen), wafer bonding, and ELTRAN® (Epitaxial Layer TRANsfer). It may be understood by a person having ordinary skill in the art that the plurality of fins may be etched from an SOI layer or from a bulk substrate. If the plurality of fins are etched from an SOI layer, they too may include any of the characteristics listed above for the SOI layer.

Fill material 102 may be deposited on top of the structure 100 using any suitable deposition technique known in the art. The fill material 102 should serve to fill in the non-active areas, of structure 100. In one embodiment, the fill material 102 may include any suitable oxide material know in the art. In one embodiment, the fill material 102 may include a high aspect ratio oxide deposited using a CVD deposition technique. The fill material 102 may have a thickness ranging from about 50 nm to about 1000 nm. In one embodiment, the fill material 102 may have a thickness ranging from about 200 nm to about 600 nm. Preferably, the fill material 102 may have a thickness greater than the height of the liner 104.

The liner 104 may include any suitable insulating material such as, for example, silicon nitride. The liner 104 may be formed using known conventional deposition techniques, for example, low-pressure chemical vapor deposition (LP-CVD). In one embodiment, the liner 104 may have a thickness ranging from about 5 nm to about 100 nm. In one embodiment, the liner 104 may be about 5-15 nm thick. In one embodiment, the liner 104 may include a similar material as the spacers 106.

One or more spacers 106 may be formed along the sidewalls high-k dielectric 108. The spacers 106 may typically be used to ensure a suitable amount of dielectric material electrically isolates the gates 110 from fill material 102. Spacers 106 may be formed by conformally depositing or growing a dielectric. In one embodiment spacers 106 may include any suitable nitride (e.g. silicon nitride, etc.). In one embodiment, the spacers 106 may have a horizontal width, or thickness, ranging from about 3 nm to about 30 nm.

Spacers 106 may include a single layer, however, the spacers 106 may include multiple layers of dielectric material.

High-k dielectric 108 is generally a dielectric material having a dielectric constant that is greater than the dielectric constant of silicon oxide, e.g., 3.9. Typically, high-k gate dielectric materials have a dielectric constant greater than 4.0, with a dielectric constant of greater than 8.0 being even more typical. Exemplary high-k dielectric materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered high-k materials can also be employed as the high-k dielectric 108. Generally, high-k dielectric 108 may be formed using widely known techniques. For example, high-k dielectric 108 can be formed utilizing a thermal oxidation and/or nitridation process or a deposition method (e.g. chemical vapor deposition (CVD), physical vapor deposition (PVD), molecular beam deposition (MBD), pulsed laser deposition (PLD), liquid source misted chemical deposition (LSMCD), atomic layer deposition (ALD), etc.). Generally high-k dielectric 108 may be formed by other known processes without deviating from the spirit of those embodiments herein claimed. It should be noted that FIGS. 1-14 show a gate dielectric 108 formed with a replacement gate (gate-last) process, such that the gate dielectric 108 is present at the bottom as well as vertical sidewalls of the gate 110. It should be understood that various embodiment of the invention are applicable to a gate-first process, where the high-k dielectric is only present at the bottom of the gate 110.

Gates 110 may be formed above and/or within the high-k dielectric 108. The gate 110 that can be employed may comprise any conductive material including, but not limited to, polycrystalline silicon, polycrystalline silicon germanium, an elemental metal (e.g., tungsten, titanium, tantalum, aluminum, nickel, ruthenium, palladium, platinum, etc.), an alloy of at least one elemental metal, an elemental metal nitride (e.g., tungsten nitride, aluminum nitride, and titanium nitride, etc.), an elemental metal silicide (e.g., tungsten silicide, nickel silicide, titanium silicide, etc.) and multilayers thereof. Gate 110 may be a single layer or multiple layer of conductive material.

Gates 110 include a plurality of sidewalls (e.g., opposing sidewalls 109, 111) and a top surface 113 and can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other liked deposition processes. When Si-containing materials are used as the gate 110 material, the Si-containing materials can be doped within an appropriate impurity by utilizing either an in-situ doping deposition process or by utilizing deposition, followed by a step such as ion implantation in which the appropriate impurity is introduced into the Si-containing material. When a metal silicide is formed, a conventional silicidation process can be employed. The gate 110 typically has a thickness from 5 nm to 200 nm, with a thickness from 20 nm to 100 nm being more typical. In some embodiments in which different polarity FETs are formed, the gate conductor material in the different active device regions can be the same or different. Different gate conductive materials can be formed using block mask technology. Generally gate 110 may be formed by other known processes without deviating from the spirit of those embodiments herein claimed.

The fill material 102, the liners 106, the high-k dielectric 108, and gates 110 may be planarized using a chemical mechanical polishing (CMP) technique. The CMP technique may remove some of the fill material 102, the liners 106, the high-k dielectric 108, and gates 110. In one embodiment, the CMP technique may use a ceria based slurry to recess the fill material 102, the liners 106, the high-k dielectric 108, and gates 110. Before being polished the fill material 102, the liners 106, the high-k dielectric 108, and gates 110 may be non-planar due to variations in pattern density. The CMP technique used to polish the fill material 102, the liners 106, the high-k dielectric 108, and gates 110 may be designed to improve planarity and may advantageously eliminate the non-planer surface of structure 100 caused by the variations in pattern density.

Figure 2:
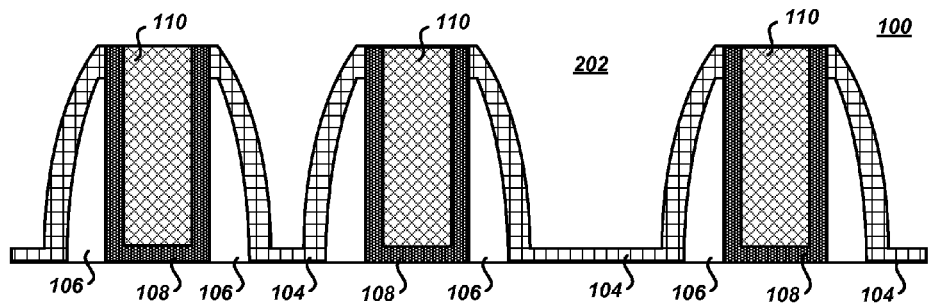

FIG. 2 depicts a cross section view of a semiconductor structure 100 at an intermediate stage semiconductor device fabrication, in accordance with various embodiments of the present invention. At this stage of fabrication, structure 100 may generally include liner 104, spacers 106, high-k dielectric 108, gates 110, and semiconductor substrate. Structure 100, as shown in FIG. 2, may generally result subsequent to a fill material removal stage 202, the details of which are described below.

Generally, fill material 102 may be removed by known techniques that remove fill material 102 selective to liner 104, spacers 106, high-k dielectric 108, and gates 110. For example, semiconductor structure 100 may be selectively etched using an etchant system, such as, for example, a reactive ion etch (RIE) or wet etch adjusted to favor oxide removal selective to the materials of liner 104, spacers 106, high-k dielectric 108, and gates 110 (e.g. silicon, silicon nitride, etc.). Fill material 102 may be removed by other specific processes without deviating from the scope of the embodiment herein claimed.

Figure 3:
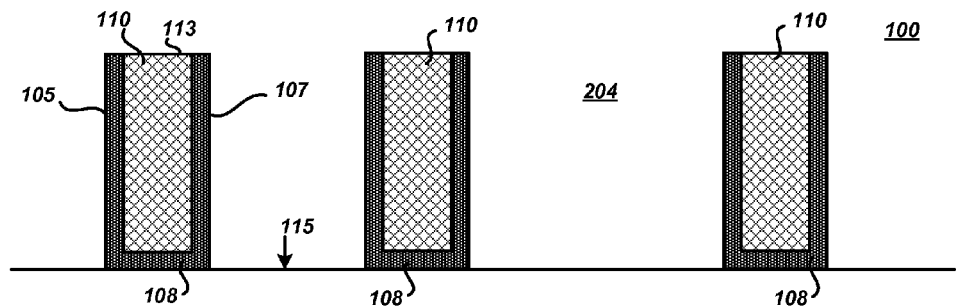

FIG. 3 depicts a cross section view of a semiconductor structure 100 at an intermediate stage semiconductor device fabrication, in accordance with various embodiments of the present invention. At this stage of fabrication, structure 100 may generally include high-k dielectric 108, gates 110, and semiconductor substrate. Structure 100, as shown in FIG. 3, may generally result subsequent to a liner and spacer removal stage 204, the details of which are described below. At stage 204, opposing high-k dielectric sidewalls 105 and 107, top surface 113 of gate 110, and top surface 115 of the semiconductor substrate are generally exposed.

Generally, liner 104 and spacers 106 may be removed by known techniques that remove liner 104 and spacers 106 selective to high-k dielectric 108 and gates 110. For example, semiconductor structure 100 may be selectively etched using an etchant system, such as, for example, a RIE or wet etch adjusted to favor nitride removal selective to the materials of high-k dielectric 108 and gates 110. Liner 104 and spacers 106 may be removed by other specific processes without deviating from the scope of the embodiment herein claimed.

In certain embodiments, fill material 102, liner 104, and spacers 106 may be removed during the same etch process by using any suitable selective etching technique such as dry etch, wet etch, or combination of both as opposed to the alternate removal of fill material 102 and then removal of liner 104 and spacers 106 presented herein.

Figure 4:
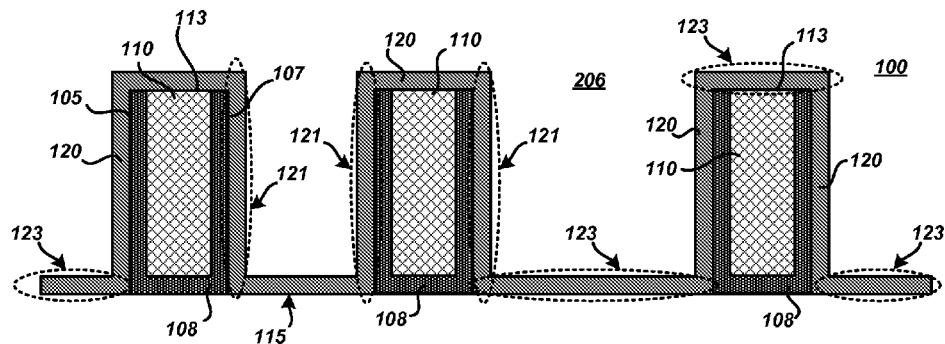

FIG. 4 depicts a cross section view of a semiconductor structure 100 at an intermediate stage semiconductor device fabrication, in accordance with various embodiments of the present invention. At this stage of fabrication, structure 100 may generally include low-k spacer layer 120, high-k dielectric 108, gates 110, and semiconductor substrate. Structure 100, as shown in FIG. 4, may generally result subsequent to a low-k spacer layer formation stage 206, the details of which are described below.

At stage 206, low-k spacer layer 120 is generally formed upon high-k dielectric sidewalls 105 and 107, top surface 113 of gate 110, and top surface 115 of the semiconductor substrate. The low-k spacer layer 120 is formed to include a plurality of vertical low-k spacer portions 121 and a plurality of horizontal low-k spacer portions 123. Vertical low-k spacer portions 121 and horizontal low-k spacer portions 123 are generally substantially orthogonal. Vertical low-k spacer portions 121 are typically formed on opposing high-k dielectric sidewalls 105 and 107 while horizontal low-k spacer portions 123 are typically formed on the top surface 115 of the semiconductor substrate and top surface 113 of gates 113. In certain embodiments where a gate-first process is used the vertical low-k spacer portion 121 is formed on opposing sidewalls 109 and 111 of the gates 110.

In certain embodiments, a first vertical low-k spacer portion 121 is formed on the sidewall of first gate 110 (or high-k dielectric sidewall) and a second vertical low-k spacer portion 121 is formed on a sidewall of a neighboring second gate 100 (or high-k dielectric sidewall), and a horizontal low-k spacer portion 123 is formed upon the top surface 115 of the semiconductor substrate between the first gate and the second gate. In certain embodiments this horizontal low-k spacer portion 123 may be formed to meet the first vertical low-k spacer portion 121 and the second vertical low-k spacer portion 121. Generally, the thicknesses of the vertical low-k spacer portions 121 and the horizontal low-k spacer portions 123 may be similar, however, in other embodiments the thicknesses of particular vertical low-k spacer portions 121 and/or horizontal low-k spacer portions 123 may differ.

Low-k spacer layer 120 is a material having a dielectric constant that is lower than the dielectric constant of silicon nitride. Exemplary low-k dielectric materials include SiBN, SiCN, organosilicate glass (OSG) and SiLK™.

Generally, low-k spacer layer 120 may be formed by known techniques. For example, low-k spacer layer 120 may be formed by a deposition process. Low-k spacer layer 120 is formed upon the substrate, upon the sidewalls of high-k dielectric 108, and upon the top surface of high-k dielectric 108 and gates 110. The low-k spacer layer 120 may be of similar thickness and/or geometry to the spacers 106. However, in certain embodiments low-k spacer layer 120 may be of a different geometry that than spacers 106 (e.g. low-k spacer layer 120 may be thinner than spacers 106, etc). In addition, this exemplary technique can provide asymmetric spacers, for example, whereby the low-k material on one side of gate 110 is etched to be thinner relative to the low-k material on the opposite side of gate 100.

Figure 5:
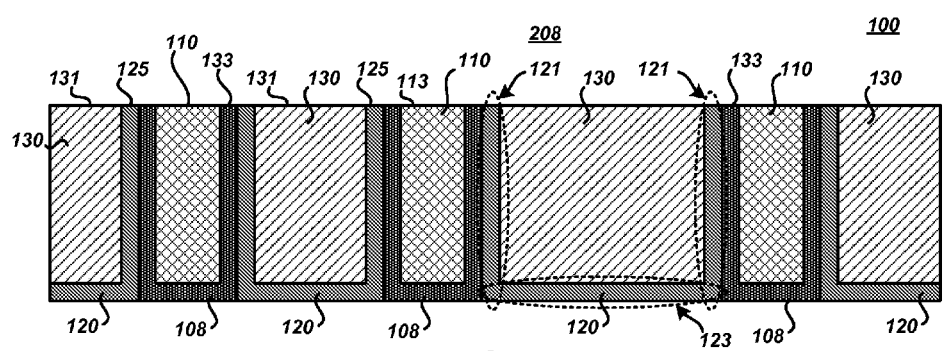

FIG. 5 depicts a cross section view of a semiconductor structure 100 at an intermediate stage semiconductor device fabrication, in accordance with various embodiments of the present invention. At this stage of fabrication, structure 100 may generally include fill material 130, low-k spacer layer 120, high-k dielectric 108, gates 110, and semiconductor substrate. Structure 100, as shown in FIG. 5, may generally result subsequent to a fill material formation stage 208, the details of which are described below.

Fill material 130 may be deposited on top of the structure 100 using any suitable deposition technique known in the art. The fill material 130 should serve to fill in the non-active areas of structure 100, generally within the area between vertical low-k spacer portions 121 and the shared horizontal low-k spacer portion 123. In one embodiment, the fill material 130 may include any suitable oxide material know in the art. In one embodiment, the fill material 130 may include a high aspect ratio oxide deposited using a CVD deposition technique. Subsequent to fill material 130 being formed, a CMP process may remove excess fill material 130 and the upper horizontal low-k spacer portions 123 upon the gates 110 thereby planarizing the top surface of semiconductor structure 100. For example, the top surfaces 131 of fill material 130, the top surfaces 125 of vertical low-k spacer portions 130, the top surfaces of 133 of high-k dielectric 108, and the top surface 113 of gate 110 may be co-planar. Co-planarity may be achieved by the CMP process having a stop at the top surface 113 of gates 110. In certain embodiments fill material 130 may be similar to fill material 102, whilst in other embodiments, fill material 130 may differ from fill material 102. Generally, fill material 130 may be formed by other known processes without deviating from the spirit of those embodiments herein claimed.

Figure 6:
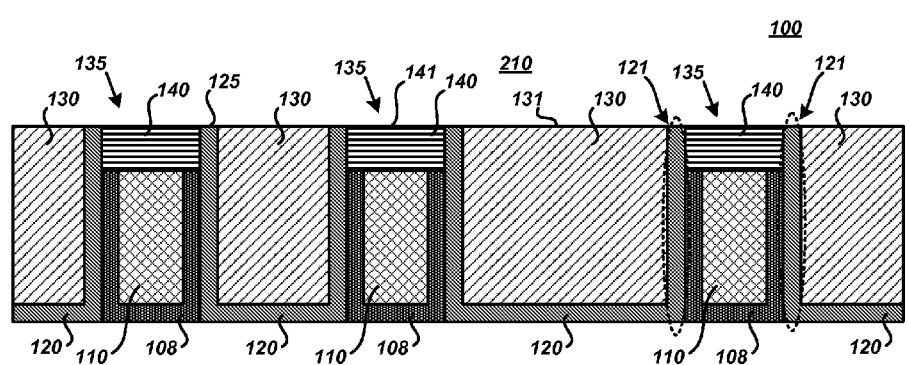

FIG. 6 depicts a cross section view of a semiconductor structure 100 at an intermediate stage semiconductor device fabrication, in accordance with various embodiments of the present invention. At this stage of fabrication, structure 100 may generally include SAC cap 140, fill material 130, low-k spacer layer 120, high-k dielectric 108, gates 110, and semiconductor substrate. Structure 100, as shown in FIG. 6, may generally result subsequent to a gate protection stage 210, the details of which are described below.

Generally, at gate protection stage 210, a plurality of gate recess 135 are formed followed by a fill and planarization processes, respectively. Recesses 135 are generally formed by removing portions of gates 110 and portions of high-k dielectric 108 within the boundary of a pair of vertical low-k spacer portions 121 that share a particular gate 110. That is, the pair of vertical low-k spacer portions 121 that share a gate 110 are maintained, thereby forming the outer diameter of a recess 135. The recesses 135 may be formed using widely known techniques (e.g. a selective etch, etc.).

Subsequent to recess 135 formation, a SAC cap 140 is formed. Typically the SAC cap 140 is silicon nitride, though other similar materials may be utilized. For example, a deposition of silicon nitride (SiN) in recesses 135 forms SAC cap 140 over gates 110. Finally, at stage 210 a CMP process may planarize semiconductor structure 100 so that top surface 141 of SAC cap 140, top surface 131 of fill material 130, and top surface 125 of vertical low-k spacer portions 121 are co-planar. Co-planarity may be achieved by the CMP process having a stop at the top surface 131 of fill material 130. Generally, recesses 135 and SAC cap 140 may be formed by other known processes without deviating from the spirit of those embodiments herein claimed.

Figure 7:
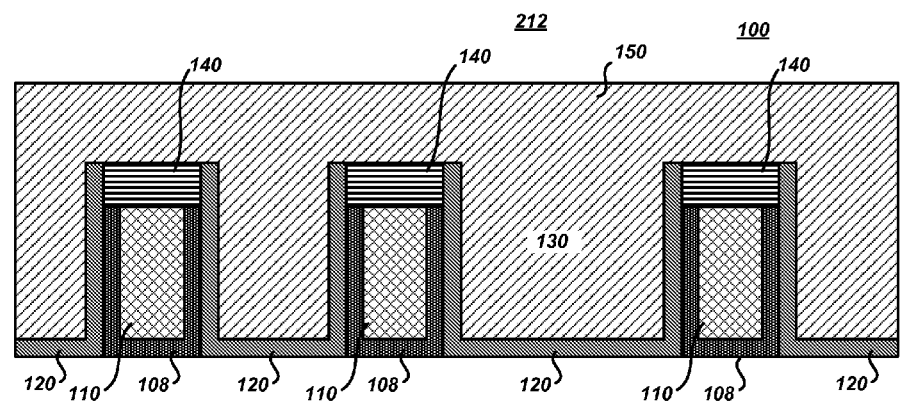

FIG. 7 depicts a cross section view of a semiconductor structure 100 at an intermediate stage semiconductor device fabrication, in accordance with various embodiments of the present invention. At this stage of fabrication, structure 100 may generally include middle of line (MOL) fill 150, SAC cap 140, fill material 130, low-k spacer layer 120, high-k dielectric 108, gates 110, and semiconductor substrate. Structure 100, as shown in FIG. 7, may generally result subsequent to a middle of line fill formation stage 212, the details of which are described below.

MOL fill 150 may be deposited on top of the structure 100 using any suitable deposition technique known in the art. The MOL fill 150 should serve to fill in the non-active areas of structure 100, generally within the area above gates 110 and/or SAC cap 140, etc. In one embodiment, the MOL fill may include any suitable oxide material know in the art. In one embodiment, the MOL fill 150 may include a high aspect ratio oxide deposited using a CVD deposition technique. Subsequent to MOL fill 150 being formed, a planarization process may remove excess MOL fill 150 thereby planarizing the top surface of semiconductor structure 100. In certain embodiments MOL fill 150 may be similar to fill material 102 and/or fill material 130 whilst in other embodiments, MOL fill 150 may differ from fill material 130 and/or fill material 102. Generally, MOL fill 150 may be formed by other known processes without deviating from the spirit of those embodiments herein claimed.

Figure 8:
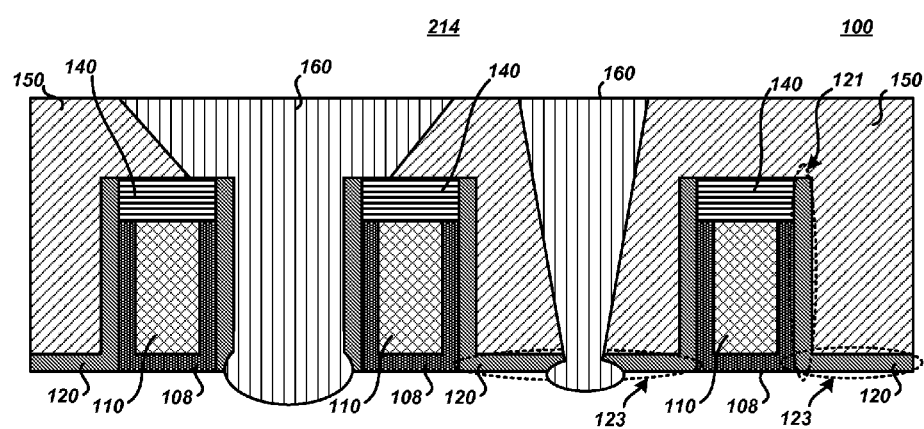

FIG. 8 depicts a cross section view of a semiconductor structure 100 at an intermediate stage semiconductor device fabrication, in accordance with various embodiments of the present invention. At this stage of fabrication, structure 100 may generally include MOL contact 160, MOL fill 150, SAC cap 140, fill material 130, low-k spacer layer 120, high-k dielectric 108, gates 110, and semiconductor substrate. Structure 100, as shown in FIG. 8, may generally result subsequent to a middle of line contact formation stage 214, the details of which are described below.

MOL contact 160 may be an electrical contact (e.g. stud, pillar, etc.) that is an interface between contact areas of structure 100, referred to as front-end-of-the-line (FEOL), and its overlying interconnects or interconnecting structures, which may be referred to as back-end-of-the-line (BEOL). MOL contacts 160 are usually formed in a layer of dielectric material (e.g. fill material 130, MOL fill 150, etc.) subsequent to the formation of openings (e.g. recesses, trenches, etc.) in the layer. MOL contact 160 may be comprised of tungsten (W) or other similar materials. The MOL contacts 160 be formed by any well known process such as, for example, a deposition CVD process. The formation of MOL contacts 160 may overfill the MOL contact 160 openings. As such, the excessive MOL contact 160 material above or over MOL contact openings may be removed by, for example, any conventional planarization technique such as a CMP process.

Typically an additional interconnect structure may be formed on top semiconductor structure 100. The additional interconnect structure may include an inter-level dielectric material, conductive trench and/or via, etc. The inter-level dielectric material may be the same or different as that of fill material 130, MOL fill 150, etc. The additional interconnect structure may be formed following conventional process at a BEOL formation stage 215. For example, a conventional via-before-line or a line-before-via process may be used. Between the additional interconnect structure and semiconductor structure 100, a capping layer may be formed. Generally, at least portions of the plurality of horizontal low-k spacer portions 123 will remain on the horizontal surface of semiconductor structure 100.

Figure 9:
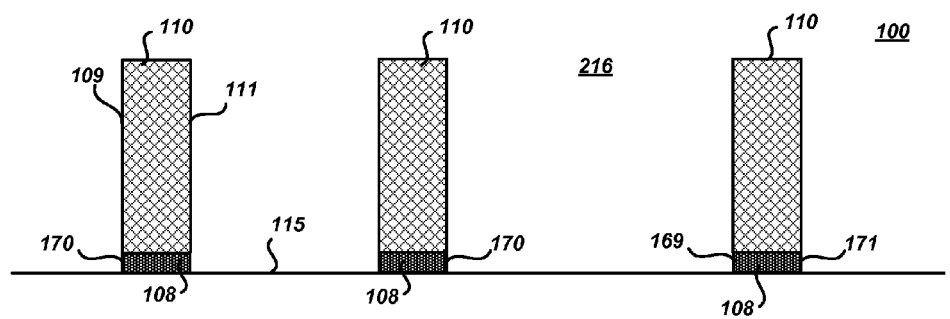

FIG. 9 depicts a cross section view of a semiconductor structure 100 at an intermediate stage semiconductor device fabrication, in accordance with various embodiments of the present invention. At this stage of fabrication, structure 100 may generally include high-k dielectric 108, gates 110, and semiconductor substrate. Structure 100, as shown in FIG. 9, may generally result subsequent to liner 104, spacers 106, and high-k dielectric 108 sidewall removal stage 216, the details of which are described below.

Stage 216 is similar to stage 204 in that top surface 113 of gate 110, and top surface 115 of the semiconductor substrate are generally exposed. However, in stage 216 the opposing high-k dielectric sidewalls 105 and 107 are also removed with liner 104 and spacers 106. When opposing high-k dielectric sidewalls 105 and 107 are removed, only high-k dielectric portion 170 separating gates 110 from the underlying semiconductor substrate remains. As such, the sidewalls 169 and 171 of high-k dielectric portion 170 are co-planar with the gate 110 sidewalls 109 and 111.

Generally, liner 104, spacers 106, and high-k dielectric sidewalls 105 and 107 may be removed by known techniques that remove liner 104, spacers 106, and high-k dielectric sidewalls 105 and 107 selective to gates 110 and the underlying semiconductor substrate. For example, semiconductor structure 100 may be selectively etched using an etchant system, such as, for example, a RIE or wet etch adjusted to favor nitride removal selective to gates 110 and the underlying semiconductor substrate. Liner 104, spacers 106, and high-k dielectric sidewalls 105 and 107 may be removed by other specific processes without deviating from the scope of the embodiment herein claimed.

In certain embodiments, fill material 102, liner 104, spacers 106, and high-k dielectric sidewalls 105 and 107 may be removed during the same etch process by using any suitable selective etching technique such as dry etch, wet etch, or combination of both.

Figure 10:
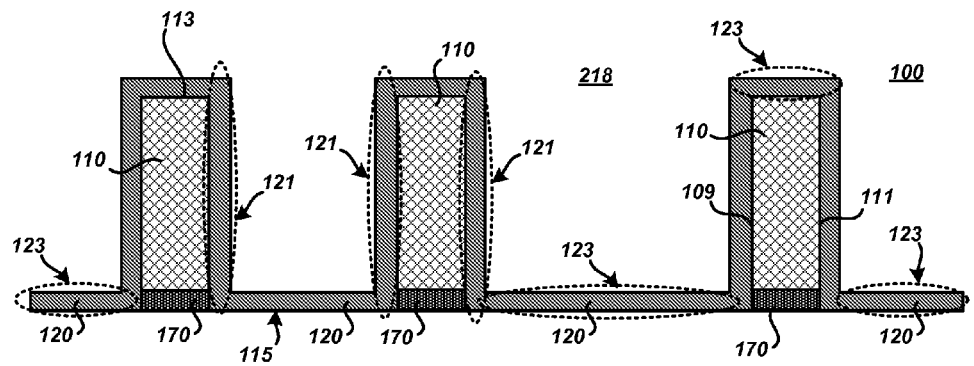

FIG. 10 depicts a cross section view of a semiconductor structure 100 at an intermediate stage semiconductor device fabrication, in accordance with various embodiments of the present invention. At this stage of fabrication, structure 100 may generally include high-k dielectric portions 170, low-k spacer layer 120, and semiconductor substrate. Structure 100, as shown in FIG. 10, may generally result subsequent to a low-k spacer layer formation stage 218, the details of which are described herein. At stage 218, low-k spacer layer 120 is generally formed upon gate 110 sidewalls 109 and 111, top surface 113 of gate 110, sidewalls 169 and 171 of high-k dielectric portion 170, and top surface 115 of the semiconductor substrate. Stage 218 is similar to stage 206 but for the removal of high-k dielectric 108 sidewalls 105 and 107.

Figure 11:
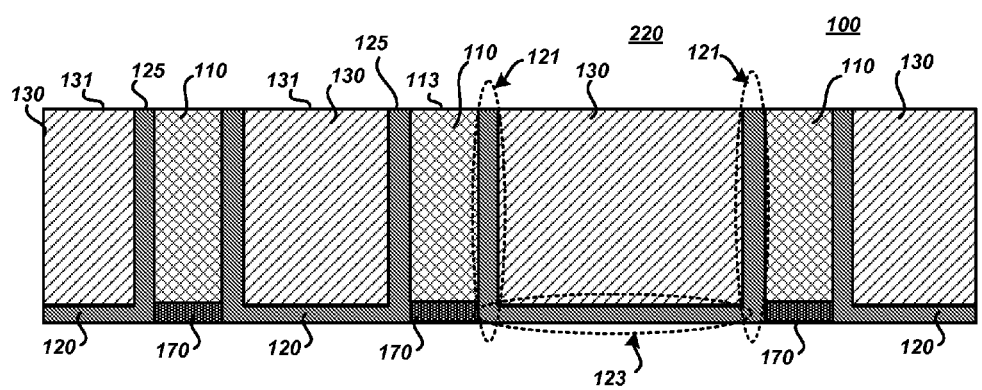

FIG. 11 depicts a cross section view of a semiconductor structure 100 at an intermediate stage semiconductor device fabrication, in accordance with various embodiments of the present invention. At this stage of fabrication, structure 100 may generally include fill material 130, low-k spacer layer 120, high-k dielectric portions 170, gates 110, and semiconductor substrate. Structure 100, as shown in FIG. 5, may generally result subsequent to a fill material formation and CMP stage 220. At stage 220, a CMP process may remove excess fill material 130 and the upper horizontal low-k spacer portions 123 upon the gates 110 thereby planarizing the top surface of semiconductor structure 100. For example, the top surfaces 131 of fill material 130, the top surfaces 125 of vertical low-k spacer portions 130, and the top surface 113 of gate 110 may be co-planar. Stage 220 is similar to stage 208 but for the removal of high-k dielectric 108 sidewalls 105 and 107.

Figure 12:
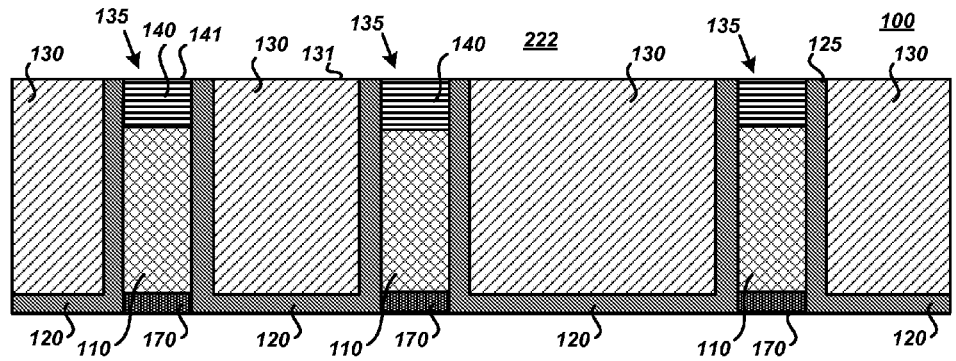

FIG. 12 depicts a cross section view of a semiconductor structure 100 at an intermediate stage semiconductor device fabrication, in accordance with various embodiments of the present invention. At this stage of fabrication, structure 100 may generally include SAC cap 140, fill material 130, low-k spacer layer 120, high-k dielectric portions 170, gates 110, and semiconductor substrate. Structure 100, as shown in FIG. 6, may generally result subsequent to a gate protection stage 222. Generally, at gate protection stage 222, a plurality of gate recess 135 are formed followed by a fill and planarization processes, respectively. Recesses 135 are generally formed by removing portions of gates 110 within the boundary of a pair of vertical low-k spacer portions 121 that share a particular gate 110. Subsequent to recess 135 formation, a SAC cap 140 may be formed and a CMP process may planarize semiconductor structure 100. Stage 222 is similar to stage 210 but for the removal of high-k dielectric 108 sidewalls 105 and 107.

Figure 13:
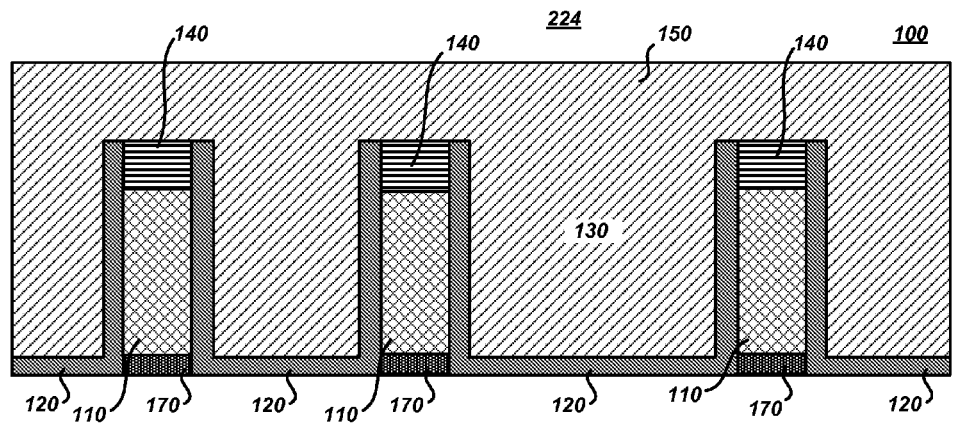

FIG. 13 depicts a cross section view of a semiconductor structure 100 at an intermediate stage semiconductor device fabrication, in accordance with various embodiments of the present invention. At this stage of fabrication, structure 100 may generally MOL fill 150, SAC cap 140, fill material 130, low-k spacer layer 120, high-k dielectric portions 170, gates 110, and semiconductor substrate. Structure 100, as shown in FIG. 13, may generally result subsequent to a MOL fill formation stage 224 similar to MOL fill formation stage 212 described above.

Figure 14:
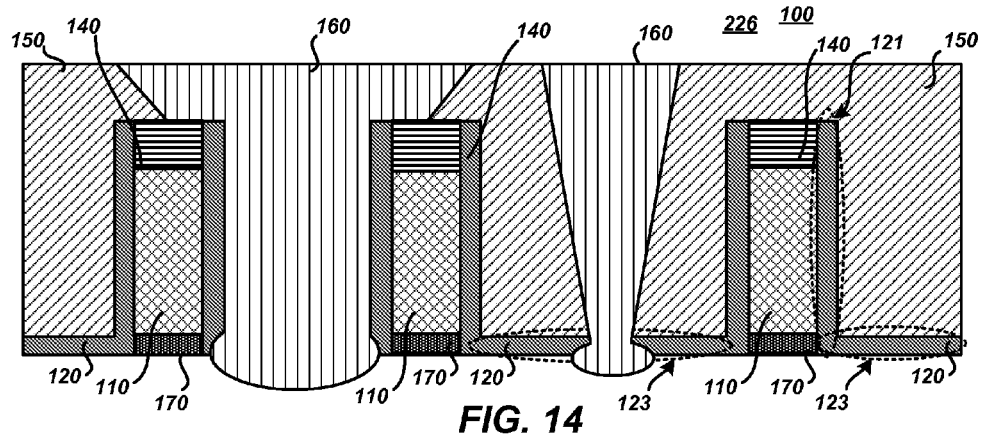

FIG. 14 depicts a cross section view of a semiconductor structure 100 at an intermediate stage semiconductor device fabrication, in accordance with various embodiments of the present invention. At this stage of fabrication, structure 100 may generally include MOL contact 160, MOL fill 150, SAC cap 140, fill material 130, low-k spacer layer 120, high-k dielectric portion 170, gates 110, and semiconductor substrate. Structure 100, as shown in FIG. 14, may generally result subsequent to a MOL contact formation and planarization stage 226 similar to MOL contact formation and planarization stage 212 described above.

Figure 15:
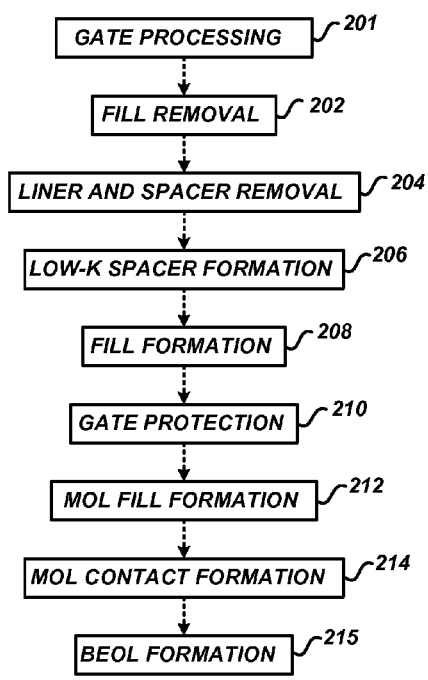
FIGS. 15-17 depict a process of fabricating a semiconductor device, in accordance with various embodiments of the present invention
Figure 16:
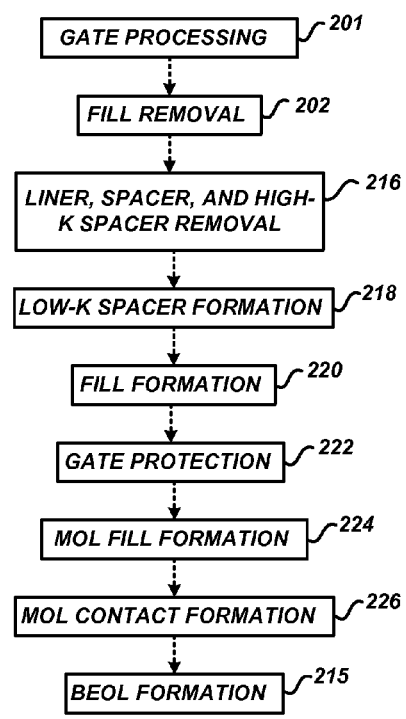

Referring now to FIG. 15, a process 200 of fabricating a semiconductor structure is shown. Process 200 may include a gate processing stage 201, a fill removal stage 202, a liner and spacer removal stage 204, a low-k spacer formation stage 206, a fill formation stage 208, a gate protection stage 210, a MOL fill formation stage 212, a MOL contact formation stage 214, and/or a BEOL formation stage 215. Referring now to FIG. 16, an alternative process 230 of fabricating a semiconductor structure is shown. Process 230 may include a gate processing stage 201, a fill removal stage 202, a liner/spacer/high-k dielectric removal stage 216, a low-k spacer formation stage 218, a fill formation stage 220, a gate protection stage 222, a MOL fill formation stage 224, a MOL contact formation stage 226, and/or a BEOL formation stage 215, Further details of each respective stage correspond to stages described in association with to the description of FIGS. 1-14.

Figure 17:
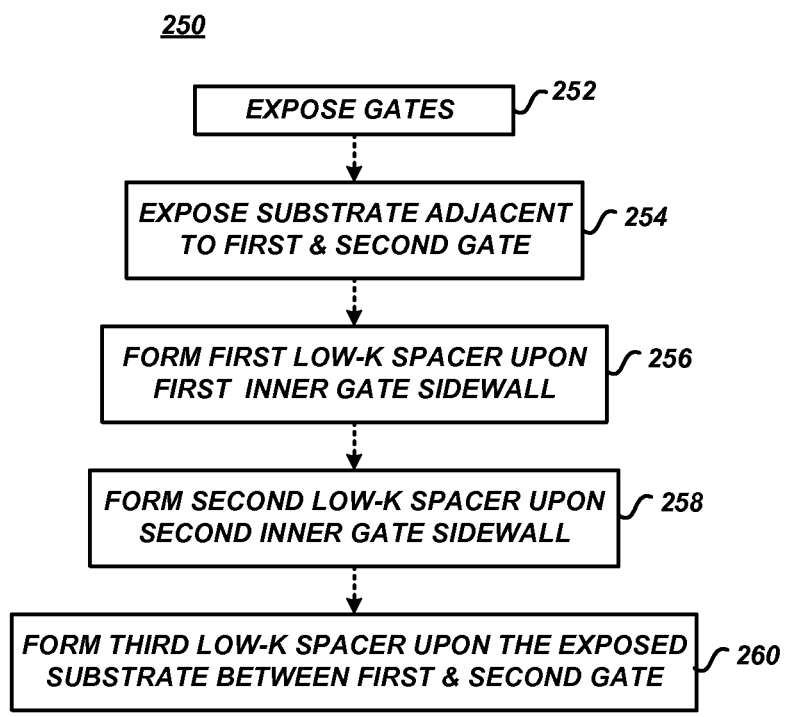

Referring now to FIG. 17, a process 250 of fabricating a semiconductor structure is shown. Process 250 includes exposing a plurality of gates comprising inner sidewalls and outer sidewalls (block 252), exposing the top surface of a semiconductor substrate adjacent to a first gate and to a second gate (block 254), forming a first low-k spacer portion upon a inner sidewall of the first gate (block 256), forming a second low-k spacer portion upon a inner sidewall of the second gate (block 258), and forming a third low-k spacer portion upon the exposed semiconductor substrate top surface between the first gate and the second gate (block 260). In certain embodiments, the first low-k spacer portion and the second low-k spacer portion may be substantially vertical (e.g. height generally greater than width, etc.) and the third low-k spacer portion may be substantially horizontal (e.g. width generally greater than height, etc.). Further, the first low-k spacer portion and the second low-k spacer portion may be substantially orthogonal to the third low-k spacer portion. In certain embodiments, forming a second low-k spacer portion upon a inner sidewall of the second gate (block 258) may further include forming the third low-k spacer portion to meet the first low-k spacer portion and the second low-k spacer portion. In certain embodiments, exposing the plurality of gates (block 252) further includes, removing a plurality of spacers adjacent to the inner sidewalls and adjacent to the outer sidewalls, removing a liner formed upon the plurality of spacers, and/or removing fill material formed upon the liner.

The fabrication of the semiconductor structure(s) herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the present invention.

Figure 18:
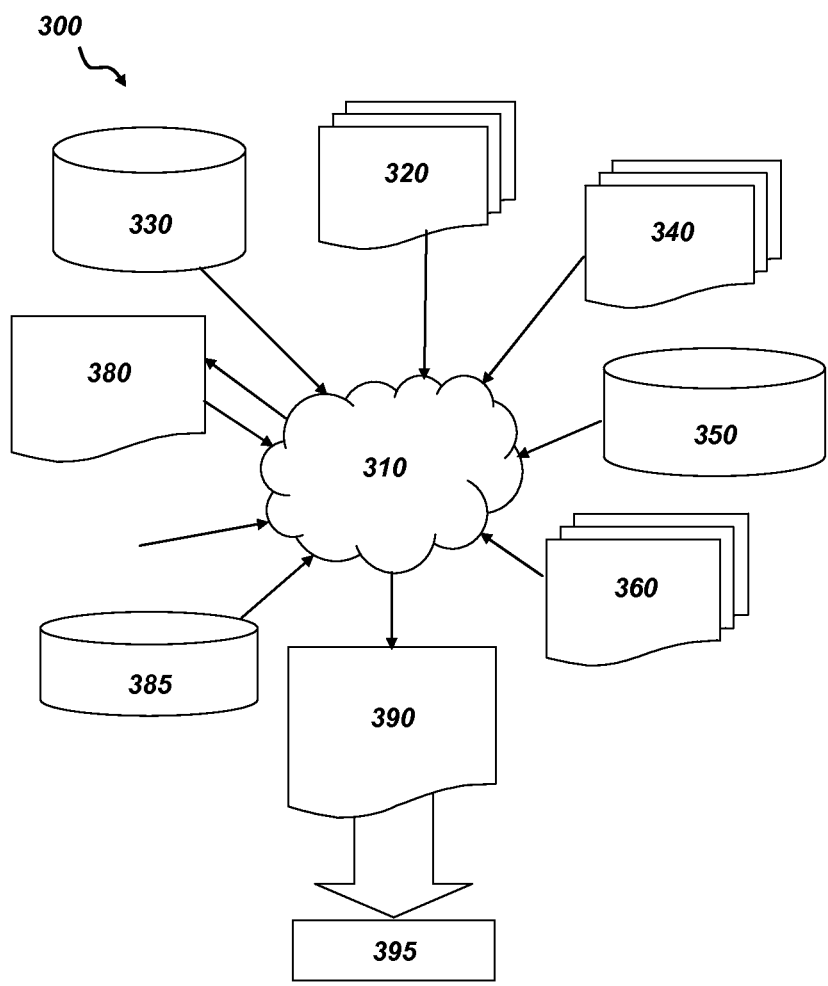
FIG. 18 depicts a flow diagram of a design process used in semiconductor design, manufacture, and/or test, in accordance with various embodiments of the present invention.

Referring now to FIG. 18, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIGS. 1-14.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 18 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIGS. 1-14. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIGS. 1-14 to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390.

Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-14. In one embodiment, design structure 390 may comprise a compiled, executable HDL simulation model that functionally simulates the devices shown in FIGS. 1-14.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-14. Design structure 390 may then proceed to a stage 395 where, for example, design structure 390: proceeds to tape-out, is released to manufacturing, is released to a mask house, is sent to another design house, is sent back to the customer, etc.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

References herein to terms such as "vertical", "horizontal", etc. are made by way of example, and not by way of limitation, to establish a frame of reference. The term "horizontal" as used herein is defined as a plane parallel to the conventional plane or surface of the substrate, regardless of the actual spatial orientation of the semiconductor substrate. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

What is claimed is:
1. A semiconductor device, comprising:
   a first gate and a second gate upon a top surface of a semiconductor substrate, the first gate and the second gate each comprising vertical sidewalls;
   a low-k spacer comprising:
      first low-k spacer portions formed upon the vertical sidewalls of the first gate and the second gate; and a second low-k spacer portion formed upon the top surface of the semiconductor substrate between the first gate and the second gate;

a first cap directly on a top surface of the first gate;

a second cap directly on a top surface of the second gate;

a first fill material directly contacting the first low-k spacer portions and the second low-k spacer portion; and a second fill material directly contacting each of the first fill material, a top surface of the first cap, and a top surface of the second cap; and a third gate, wherein a third portion of the low-k spacer is formed on a sidewall of the third gate; and an electrical contact between the first gate and the third gate directly contacts the third portion of the low-k spacer.

2. The semiconductor device of claim 1 wherein the first low-k spacer portions are substantially vertical and wherein the second low-k spacer portion is substantially horizontal.

3. The semiconductor device of claim 1 wherein the dielectric constant of the low-k spacer is less than the dielectric constant of silicon nitride.

4. The semiconductor device of claim 3, wherein the first cap and the second cap each comprises silicon nitride.

5. The semiconductor device of claim 1 wherein the first low-k spacer portions are substantially orthogonal to the second low-k spacer portion.

6. The semiconductor device of claim 1 wherein the second low-k spacer portion is formed to meet the first low-k spacer portions.

7. The semiconductor device of claim 1, wherein the thicknesses of the first low-k spacer portions and the second low-k spacer portion are substantially similar.

8. The semiconductor device of claim 1, wherein the first fill material and the second fill material each comprises an oxide fill material.

9. The semiconductor device of claim 1, further comprising a second electrical contact between the first gate and the second gate, wherein the second electrical contact extends through the first fill material and the second low-k spacer portion.

10. A semiconductor device, comprising:

a first gate structure comprising a first high-k dielectric layer, a first gate, and a first cap directly on a top surface of the first gate;

a second gate structure comprising a second high-k dielectric layer, a second gate, and a second cap directly on a top surface of the second gate;

a low-k spacer layer on a sidewall of the first gate, a sidewall of the second gate, and a surface of a substrate between the first gate and the second gate; and a first fill material on the low-k spacer layer including a horizontal portion of the low-k spacer layer that is on the surface of the substrate between the first gate and the second gate;

a second fill material that directly contacts a top surface of the first cap and a top surface of the second cap;

a third gate structure comprising a third high-k dielectric layer, a third gate, and a third cap directly on a top surface of the third gate, wherein:

a vertical portion of the low-k spacer layer is on a sidewall of the third gate; and an electrical contact between the first gate structure and the third gate structure directly contacts the vertical portion of the low-k spacer layer.

11. The semiconductor device of claim 10, wherein the dielectric constant of the low-k spacer layer is less than the dielectric constant of silicon nitride.

12. The semiconductor device of claim 11, wherein the low-k spacer layer has a substantially uniform thickness.

13. The semiconductor device of claim 11, wherein the first cap and the second cap are silicon nitride.

14. The semiconductor device of claim 11, wherein:

the low-k spacer layer comprises a vertical portion on the sidewall of the first gate; and a top surface of the vertical portion of the low-k spacer layer is coplanar with the top surface of the first cap.

15. The semiconductor device of claim 11, wherein the low-k spacer layer directly contacts a vertical sidewall of the first high-k dielectric layer, a vertical sidewall of the first cap, a vertical sidewall of the second high-k dielectric layer, a vertical sidewall of the second cap.

16. The semiconductor device of claim 10, further comprising a second electrical contact between the first gate structure and the second gate structure, wherein the second electrical contact extends through the first fill material and the horizontal portion of the low-k spacer layer that is on the surface of the substrate between the first gate and the second gate.

* * * * *